(12) United States Patent
Shi

(10) Patent No.: US 10,304,959 B2
(45) Date of Patent: May 28, 2019

(54) ARRAY SUBSTRATE, DISPLAY DEVICE, AND METHOD OF MANUFACTURING THE SAME

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/557,095

(22) PCT Filed: Aug. 18, 2017

(86) PCT No.: PCT/CN2017/097988
§ 371 (c)(1),
(2) Date: Sep. 9, 2017

(87) PCT Pub. No.: WO2019/015004
PCT Pub. Date: Jan. 24, 2019

(65) Prior Publication Data
US 2019/0019896 A1 Jan. 17, 2019

(51) Int. Cl.
*H01L 29/786* (2006.01)
*H01L 29/66* (2006.01)
*H01L 27/12* (2006.01)
*G02F 1/1368* (2006.01)
*H01L 21/443* (2006.01)
*H01L 27/32* (2006.01)

(52) U.S. Cl.
CPC .. *H01L 29/78642* (2013.01); *H01L 29/66969* (2013.01); *H01L 29/78618* (2013.01); *H01L 29/78693* (2013.01); *G02F 1/1368* (2013.01); *G02F 2001/13685* (2013.01); *H01L 21/443* (2013.01); *H01L 27/1225* (2013.01); *H01L 27/3262* (2013.01)

(58) Field of Classification Search
CPC .................. H01L 29/78642; H01L 29/78693
See application file for complete search history.

(56) References Cited

U.S. PATENT DOCUMENTS 4,701,996 A * 10/1987 Calviello ............ H01L 29/8122
257/E29.05

* cited by examiner

*Primary Examiner* — Thomas L Dickey
(74) *Attorney, Agent, or Firm* — Andrew C. Cheng

(57) ABSTRACT

The present invention discloses an array substrate, a display device, and a method of manufacturing the same. Wherein, the array substrate comprises a substrate; a source electrode layer formed on the substrate; a support layer formed on the source electrode layer; a drain electrode layer formed on the support layer; a barrier layer covering the drain electrode layer; an active layer formed on the barrier layer; the barrier layer isolating the support layer and the active layer. By the above-mentioned structure, the fluorine atoms in the support layer can be prevented from entering the active layer, thereby improving the reliability of the array substrate.

10 Claims, 2 Drawing Sheets

ARRAY SUBSTRATE, DISPLAY DEVICE, AND METHOD OF MANUFACTURING THE SAME

FIELD OF THE INVENTION

The present invention relates to a technology of flat display, and more particularly, to an array substrate, a display device, and a method of manufacturing the same.

DESCRIPTION OF PRIOR ART

Flat display devices have been widely used, because of its thin body, power saving, no radiation and many other advantages. The existing flat display device mainly includes liquid crystal display (LCD) device and organic light emitting diode display (OLED) device. In the production process of display, the vertical thin film transistor because of the small size, is conducive to be widely used in the design of the resolution greater than 2000 ppi.

In the long-term research and development, the inventor of the present application has found that, in the prior art, when in the production process of the support layer between a source electrode layer and a drain electrode layer of the vertical thin film transistor, because a fluorine atom containing material is used for processing, a large amount of fluorine atoms will remain, and the fluorine atoms diffuse into an active layer, it will affect the electrical conductivity of the thin film transistor, thus affecting the reliability of the array substrate.

SUMMARY OF THE INVENTION

The technical problem that the present invention mainly solves is to provide an array substrate, a display device, and a method of manufacturing the same. By isolating a support layer and an active layer, it is possible to prevent the fluorine atoms in the support layer from entering the active layer, thereby improving the reliability of the array substrate.

In order to solve the above-mentioned technical problem, a technical solution adopted by the present invention is to provide a display device, which comprises an array substrate, the array substrate comprises a substrate; a source electrode layer formed on the substrate; a support layer formed on the source electrode layer; a drain electrode layer formed on the support layer; a barrier layer covering the drain electrode layer; an active layer formed on the barrier layer; the barrier layer isolating the support layer and the active layer; the barrier layer being an insulating layer formed of silicon oxide or silicon nitride; the barrier layer having a thickness of 200 A-10000 A.

In order to solve the above-mentioned technical problem, a technical solution adopted by the present invention is to provide an array substrate, which comprises: a substrate; a source electrode layer formed on the substrate; a support layer formed on the source electrode layer; a drain electrode layer formed on the support layer; a barrier layer covering the drain electrode layer; an active layer formed on the barrier layer; and the barrier layer isolating the support layer and the active layer.

In order to solve the above-mentioned technical problem, a technical solution adopted by the present invention is to provide a manufacturing method of array substrate, which comprises: forming a source electrode layer and a support layer sequentially on a substrate; forming a drain electrode layer on the support layer; depositing a barrier layer on the drain electrode layer; depositing an active layer on the barrier layer, the barrier layer isolating the support layer and the active layer.

The present invention can be concluded with the following advantages, by covering the barrier layer on the drain electrode layer, isolating the support layer that between the source electrode layer and the drain electrode layer, and the active layer, it is possible to prevent the fluorine atoms in the support layer from entering the active layer, thereby improving the reliability of the array substrate.

DESCRIPTION OF PREFERRED EMBODIMENT

Technical implementation will be described below clearly and fully by combining with drawings made in accordance with an embodiment in the present invention.

Figure 1:
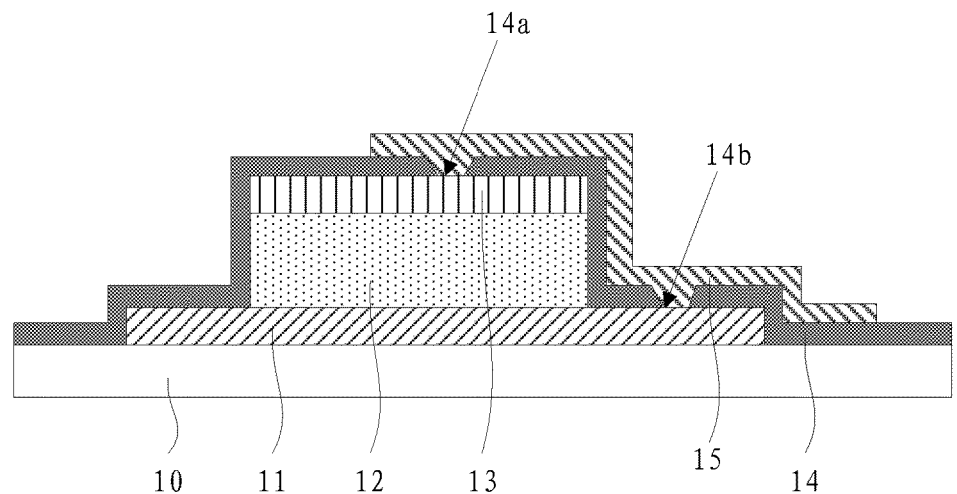
FIG. 1 is a structural illustration of an embodiment in accordance to an array substrate in the present invention.

Referring to FIG. 1, FIG. 1 is a structural illustration of an embodiment in accordance to an array substrate in the present invention. The array substrate comprises: a substrate 10; a source electrode layer 11 formed on the substrate 10; a support layer 12 formed on the source electrode layer 11; a drain electrode layer 13 formed on the support layer 12; a barrier layer 14 covering the drain electrode layer 13; an active layer 15 formed on the barrier layer 14; the barrier layer 14 isolating the support layer 12 and the active layer 15.

Wherein, the substrate 10 may be a glass substrate or a flexible substrate, and in some applications, a silica substrate may also be used, or a polyvinyl chloride (PVC), polytetrafluoroethylene (PFA), polyethylene terephthalate (PET) substrate, and the like. In other embodiments, before forming the source electrode layer 11, a buffer layer of a certain thickness may be deposited on the substrate (not shown in figure). The deposition material may be made from a single layer or a plurality of layers of silicon oxide (SiOx) or silicon nitride (SiNx), for increasing the degree of adhesion between the source electrode layer 11 that to be formed and the substrate 10, thereby reducing the heat conduction effect. The source electrode layer 11 and the drain electrode layer 13 are arranged on the substrate 10 in parallel. The support layer 12 is an insulating layer for supporting or isolating the source electrode layer 11 and the drain electrode layer 13. Because a large amount of carbon tetrafluoride (CF4) and oxygen (O2) are added during the etching process of the support layer 12, a part of the fluorine atoms remains in the support layer 12. Specifically, the barrier layer 14 may be made from silicon oxide (SiOx), silicon nitride (SiNx), or the like in some applications, and may be made from other insulating materials in other application scenarios.

Preferably, the barrier layer 14 has a thickness of 200 A-10000 A. The active layer 15 is an oxide semiconductor layer, specifically, and the active layer may be made from amorphous oxides such as at least one of indium oxide, zinc oxide, tin oxide, gallium oxide, and the like.

Further, a first contact hole 14a is arranged on the barrier layer 14 for exposing a portion of the drain electrode layer 13, and a second contact hole 14b is further arranged on the barrier layer 14 for exposing a portion of the source electrode layer 11, the active layer 15 is directly connected to the drain electrode layer 13 and the source electrode layer 11 via the first contact hole 14a and the second contact hole 14b.

By the above description, isolating the support layer that between the source electrode layer and the drain electrode layer, and the active layer, and the fluorine atoms in the support layer can be prevented from entering the active layer, thereby improving the reliability of the array substrate.

Figure 2:
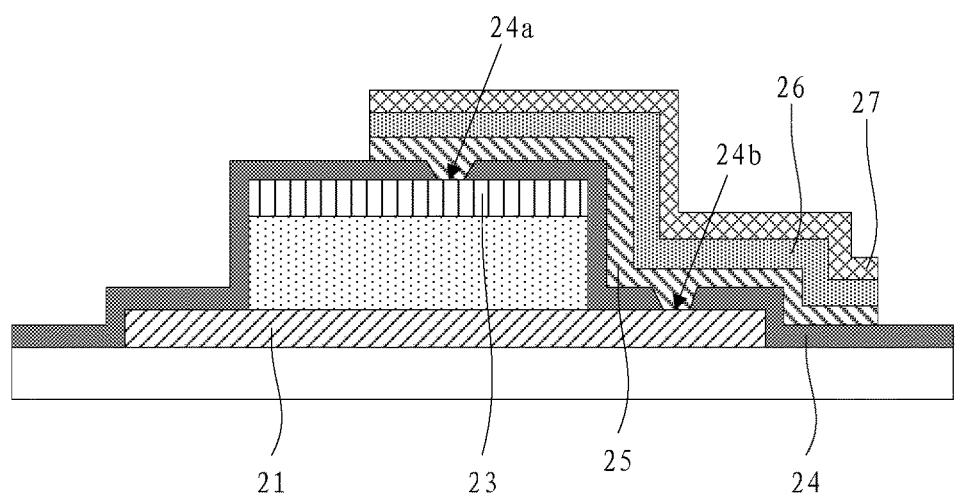
FIG. 2 is a structural illustration of another embodiment in accordance to an array substrate in the present invention.

Referring to FIG. 2, FIG. 2 is a structural illustration of another embodiment in accordance to an array substrate in the present invention. As shown in FIG. 2, the array substrate further comprises a gate insulating layer 26 formed on an active layer 25, and a gate electrode layer 27 formed on the gate insulating layer 26.

Wherein, specifically, the gate insulating layer 26 may be made from silicon oxide (SiOx), or silicon nitride (SiNx), or the like. The gate electrode layer 27 may be a single metal layer or a composite metal layer such as chromium (Cr), molybdenum (Mo), molybdenum (Mo) or aluminum (Al), copper (Cu), and the like. The gate electrode layer 27 and the source electrode layer 21 and the drain electrode layer 23, form a thin gate transistor with top gate structure, and the source and drain electrodes can be regarded as two electrodes that do not distinguish.

Further, the active layer 25 is an oxide semiconductor layer, the oxide semiconductor layer is directly connected to the drain electrode layer 23 and the source electrode layer 21 via the first contact hole 24a and the second contact hole 24b of a barrier layer 24, to form a vertical type oxide thin film transistor.

Wherein, specifically, the active layer 25 is made from indium gallium zinc oxide (IGZO), it can improve the charge and discharge rate of the thin film transistor to the pixel electrode, improve the response speed of the pixel, realize the faster refresh rate, and improve the scanning rate of the pixel.

Figure 3:
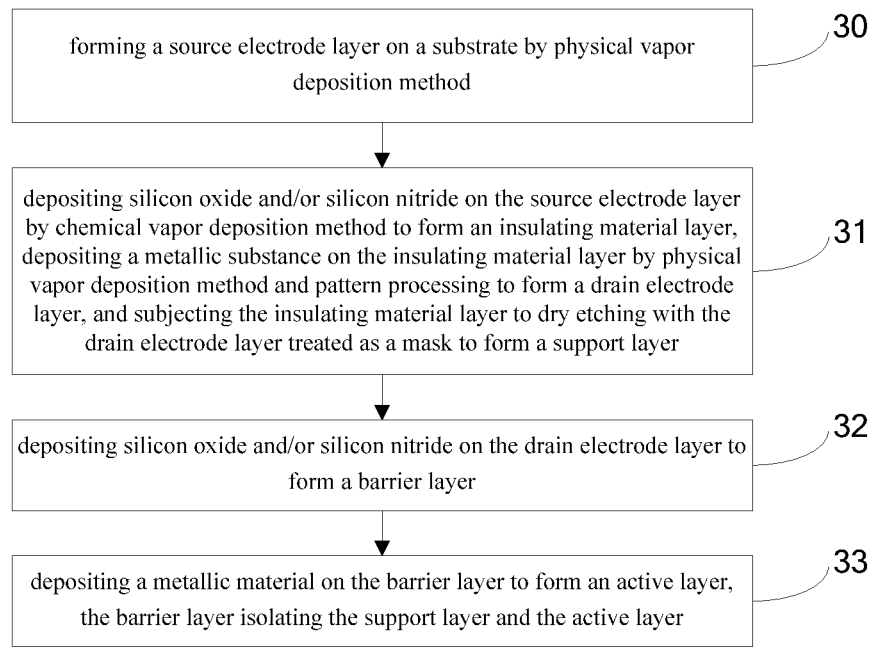
FIG. 3 is a flow chart of a manufacturing method of array substrate of an embodiment in the present invention.

Referring to FIG. 3, FIG. 3 is a flow chart of a manufacturing method of array substrate of an embodiment in the present invention. Wherein the manufacturing method of array substrate comprises the following steps:

S30: forming a source electrode layer on a substrate by physical vapor deposition method.

The substrate may be made form a transparent material, specifically, a transparent organic material isolating water and oxygen, or glass. It is commonly used glass substrate, silica substrate, there are some applications can be used polyvinyl chloride (PVC), soluble polytetrafluoroethylene (PFA), polyethylene terephthalate (PET) substrates. In other embodiments, before the source electrode layer is formed, a buffer layer of a certain thickness may be deposited on the substrate (not shown in figure). The deposition material may be made from a single layer or a plurality of layers of silicon oxide (SiOx) or silicon nitride (SiNx), for increasing the degree of adhesion between the source electrode layer that to be formed and the substrate, thereby reducing the heat conduction effect.

In the specific embodiment, a source electrode layer having a predetermined pattern is formed on the substrate by physical vapor deposition (PVD) method, followed by photoresist coating, exposure, development, etching, and photoresist peeling.

S31: depositing silicon oxide and/or silicon nitride on the source electrode layer by chemical vapor deposition method to form an insulating material layer, depositing a metallic substance on the insulating material layer by physical vapor deposition method and pattern processing to form a drain electrode layer, and subjecting the insulating material layer to dry etching with the drain electrode layer treated as a mask to form a support layer.

In the specific embodiment, depositing a silicon oxide (SiOx) film layer or a silicon nitride (SiNx) film layer on the source electrode layer by chemical vapor deposition (CVD) method and a yellow light etching process, or a stack of silicon oxide (SiOx) and silicon nitride (SiNx), to form an insulating material layer to prepare for forming a support layer. By the physical vapor deposition (PVD) method, through the exposure, etching and other processes, forming an insulating material layer on the drain electrode layer, and treating the drain as a mask, processing dry etching to the insulating material layer to form the support layer finally. Due to the addition of carbon tetrafluoride (CF4) and oxygen (O2), in the etching process, the support layer will remain part of the fluorine atoms.

S32: depositing silicon oxide and/or silicon nitride on the drain electrode layer to form a barrier layer.

By chemical vapor deposition (CVD) and yellow etch process on the drain pattern, depositing a single layer of silicon oxide (SiOx) film or silicon nitride (SiNx) film layer, or a stack of silicon oxide (SiOx) and nitridation Silicon (SiNx), to form a barrier layer. The barrier layer isolates the support layer and the active layer formed later, effectively preventing the fluorine atoms from entering the active layer.

S33: depositing a metallic material on the barrier layer to form an active layer, the barrier layer isolating the support layer and the active layer.

Preferably, the barrier layer has a thickness of 200 A-10000 A.

Further, the method further comprises: forming a gate insulating layer and a gate electrode layer sequentially on the active layer; forming a thin film transistor with top gate structure by the gate electrode layer, the source electrode layer and the drain electrode layer.

Further, the active layer is an oxide semiconductor layer; in the performance of depositing an active layer on the barrier layer, which comprising: opening holes in the barrier layer to form a first contact hole and a second contact hole passing to the drain electrode layer and the source electrode layer; depositing an oxide semiconductor layer on the barrier layer, so that the oxide semiconductor layer is directly connected to the drain electrode layer and the source electrode layer via the first contact hole and the second contact hole, to form a vertical type oxide thin film transistor.

In the specific embodiment, opening holes in the barrier layer to form a first contact hole and a second contact hole passing to the drain electrode layer and the source electrode layer, depositing at least one of indium oxide, zinc oxide, tin oxide, gallium oxide, and the like on the barrier layer, to form an active layer, so that the oxide semiconductor layer is directly connected to the drain electrode layer and the source electrode layer via the first contact hole and the second contact hole.

By the above-described method, it is possible to effectively prevent the active layer from being affected by the fluorine atoms in the support layer, thereby improving the reliability of the array substrate.

Figure 4:
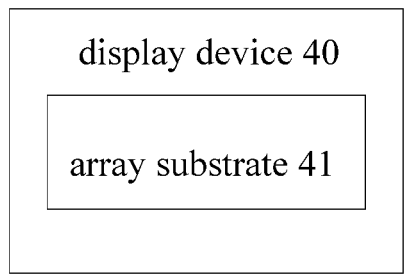
FIG. 4 is a structural illustration in accordance to a display device in the present invention.

The present invention further comprises a display device, as shown in FIG. 4, the display device 40 comprises an array substrate 41 of any of the above-described structures, or an array substrate 41 manufactured by any one of the above-described methods. The specific embodiment is as described above, the above-described method can be used to manufacture the array substrate as shown in FIG. 1 or FIG. 2, therefore no additional description is given herebelow. Further, the display device may be an active matrix organic light emitting diode (AMOLED) or a thin film transistor liquid crystal display (TFT LCD) device.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A display device, wherein the display device comprises an array substrate,
the array substrate comprises a substrate, a source electrode layer formed on the substrate; a support layer formed on the source electrode layer; a drain electrode layer formed on the support layer; a barrier layer covering the drain electrode layer; an active layer formed on the barrier layer; the barrier layer isolating the support layer and the active layer; the barrier layer being an insulating layer formed of silicon oxide or silicon nitride; the barrier layer having a thickness of 200 A-10000 A;
wherein the active layer is an oxide semiconductor layer; a first contact hole arranged on the barrier layer for exposing a portion of the drain electrode layer; a second contact hole further arranged on the barrier layer for exposing a portion of the source electrode layer; the oxide semiconductor layer directly connected to the drain electrode layer and the source electrode layer via the first contact hole and the second contact hole.

2. The display device as recited in claim 1, wherein the array substrate further comprises:
a gate insulating layer formed on the active layer;
a gate electrode layer formed on the gate insulating layer;
a thin film transistor with top gate structure formed by the gate electrode layer, the source electrode layer and the drain electrode layer.

3. The display device as recited in claim 1, wherein the array substrate comprises the following manufacturing method:
forming a source electrode layer on a substrate by physical vapor deposition method;
depositing silicon oxide and/or silicon nitride on the source electrode layer by chemical vapor deposition method to form an insulating material layer, depositing a metallic substance on the insulating material layer by physical vapor deposition method and pattern processing to form a drain electrode layer, and subjecting the insulating material layer to dry etching with the drain electrode layer treated as a mask to form a support layer;
depositing silicon oxide and/or silicon nitride on the drain electrode layer to form a barrier layer;
depositing a metallic material on the barrier layer to form an active layer, the barrier layer isolating the support layer and the active layer.

4. The display device as recited in claim 3, wherein the array substrate comprises the following manufacturing method:
forming a gate insulating layer and a gate electrode layer sequentially on the active layer;
forming a thin film transistor with top gate structure by the gate electrode layer, the source electrode layer and the drain electrode layer.

5. The display device as recited in claim 4, wherein the display device is an active matrix organic light emitting diode or a thin film transistor liquid crystal display device.

6. An array substrate, wherein the array substrate comprises:
a substrate;
a source electrode layer formed on the substrate;
a support layer formed on the source electrode layer;
a drain electrode layer formed on the support layer;
a barrier layer covering the drain electrode layer;
an active layer formed on the barrier layer; and
the barrier layer isolating the support layer and the active layer;
a gate insulating layer formed on the active layer;
a gate electrode layer formed on the gate insulating layer;
a thin film transistor with top gate structure formed by the gate electrode layer, the source electrode layer and the drain electrode layer;
wherein the active layer is an oxide semiconductor layer; a first contact hole arranged on the barrier layer for exposing a portion of the drain electrode layer; a second contact hole further arranged on the barrier layer for exposing a portion of the source electrode layer;
the oxide semiconductor layer directly connected to the drain electrode layer and the source electrode layer via the first contact hole and the second contact hole.

7. The array substrate as recited in claim 6, wherein the barrier layer is an insulating layer formed of silicon oxide or silicon nitride.

8. The array substrate as recited in claim 6, wherein the barrier layer has a thickness of 200 A-10000 A.

9. A manufacturing method of array substrate, wherein the method comprises:
forming a source electrode layer on a substrate by physical vapor deposition method;
depositing silicon oxide and/or silicon nitride on the source electrode layer by chemical vapor deposition method to form an insulating material layer, depositing a metallic substance on the insulating material layer by physical vapor deposition method and pattern processing to form a drain electrode layer, and subjecting the insulating material layer to dry etching with the drain electrode layer treated as a mask to form a support layer;
depositing silicon oxide and/or silicon nitride on the drain electrode layer to form a barrier layer;
depositing a metallic material on the barrier layer to form an active layer, the barrier layer isolating the support layer and the active layer;
forming a gate insulating layer and a gate electrode layer sequentially on the active layer;
forming a thin film transistor with top gate structure by the gate electrode layer, the source electrode layer and the drain electrode layer;
wherein the active layer is an oxide semiconductor layer;
in the performance of depositing an active layer on the barrier layer, which comprising:
opening holes in the barrier layer to form a first contact hole and a second contact hole passing to the drain electrode layer and the source electrode layer;
depositing an oxide semiconductor layer on the barrier layer, so that the oxide semiconductor layer is directly connected to the drain electrode layer and the source electrode layer via the first contact hole and the second contact hole.

10. The method as recited in claim 9, wherein the barrier layer has a thickness of 200 Å-10000 Å.

* * * * *